United States Patent [19]
Swartz et al.

[11] 3,956,820
[45] May 18, 1976

[54] METHOD OF MANUFACTURING A SEMICONDUCTOR DEVICE HAVING A LEAD BONDED TO A SURFACE THEREOF

[75] Inventors: George Allan Swartz, Plainsboro, N.J.; Richard Earl Chamberlain, Yardley, Pa.

[73] Assignee: RCA Corporation, New York, N.Y.

[22] Filed: Feb. 26, 1975

[21] Appl. No.: 553,150

[52] U.S. Cl. .................... 29/577; 29/578; 29/580; 357/45; 357/56
[51] Int. Cl.² ................................ B01J 17/00
[58] Field of Search ................. 29/578, 580, 577

[56] References Cited
UNITED STATES PATENTS
3,786,560  1/1974  Cunningham ................. 29/580

*Primary Examiner*—W. Tupman
*Attorney, Agent, or Firm*—H. Christoffersen; Robert P. Williams; Thomas H. Magee

[57] ABSTRACT

An improved method of manufacturing a semiconductor device having a lead bonded to a surface thereof, wherein the device is fabricated by removing a section of a substrate which surrounds a surface portion of the substrate comprising the surface to which the lead is bonded, includes bonding the lead to the surface portion of the substrate prior to removing the section.

9 Claims, 8 Drawing Figures

U.S. Patent  May 18, 1976  3,956,820
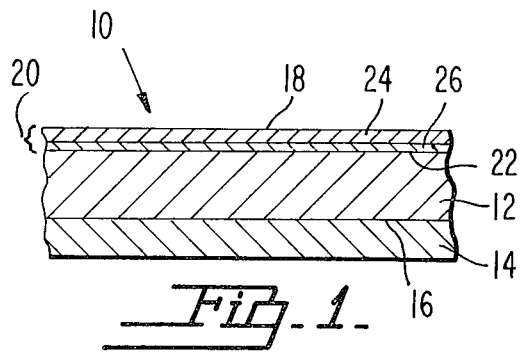
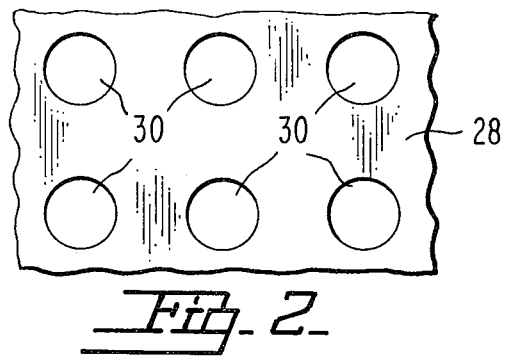
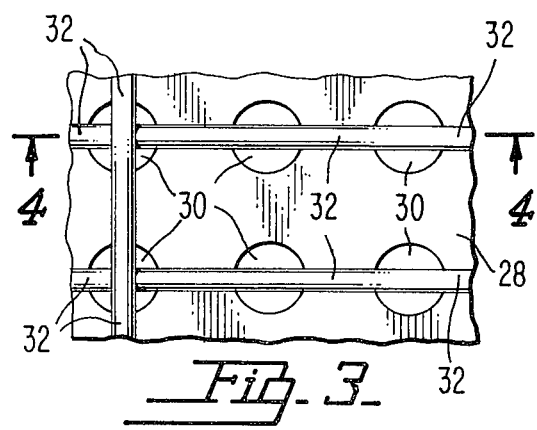
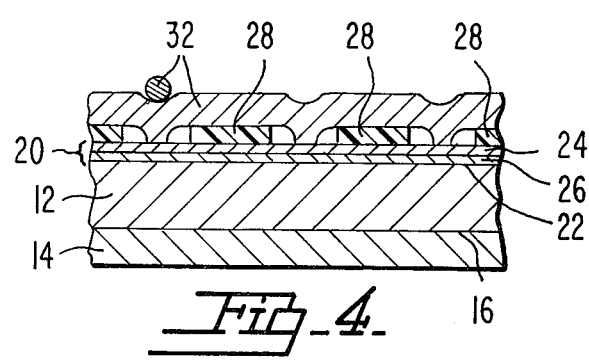
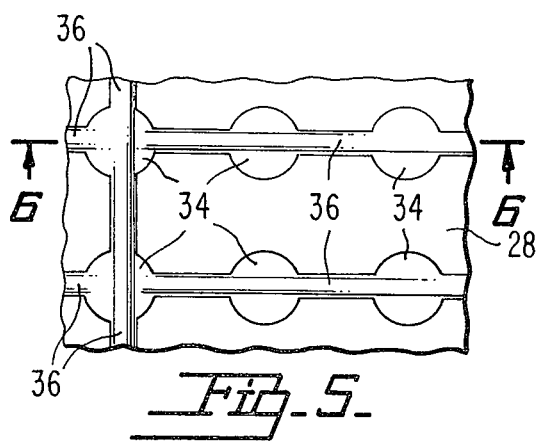
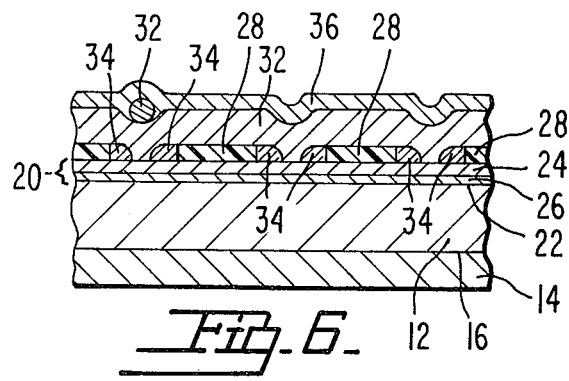
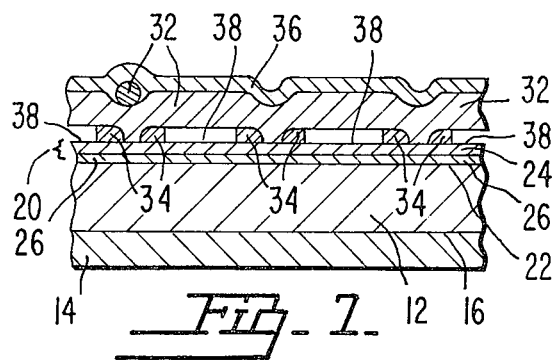
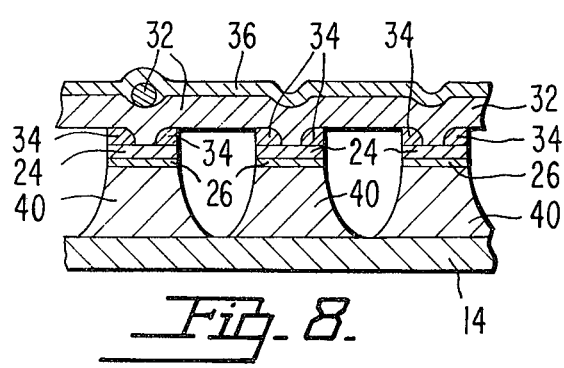

METHOD OF MANUFACTURING A SEMICONDUCTOR DEVICE HAVING A LEAD BONDED TO A SURFACE THEREOF

This invention relates to an improved method of manufacturing a semiconductor device having a lead bonded to a surface thereof.

The temperature rise of a semiconductor device, such as an avalanche diode, is often a critical factor in limiting device performance and can ultimately lead to temperatures high enough to cause device failure. In order to reduce the temperature rise while maintaining a large power output, a semiconductor device sometimes takes the form of a semiconductor array having a plurality of elements connected in parallel, such as an array of several diodes where the diameter of each diode in the array is small enough so that thermal spreading will limit the temperature rise and the diode to diode spacing is large enough so that the thermal spreading of one diode does not overlap with that of an adjacent diode. The reason for a limited temperature rise in such an array is that thermal spreading occurs at the diode edge. The greater the thermal spreading, the lower will be the temperature of the diode, therefore the more "edge" a diode has, the lower will be the temperature of operation. The multiple-diode array presents a configuration which can have a greater periphery to area ratio than circular ring structures or stripe geometries, and thus can have a lower thermal resistance.

Such a multiple-diode array is typically manufactured by first doping a semiconductor wafer with conductivity modifiers to form a desired structure for the elements. Metal films are then deposited on both sides of the wafer using a conventional deposition process such as, for example, vacuum sputtering. A layer of metal having good thermal and electrical conductivity is formed adjacent to one of the metal films in order to provide structural support for the elements, act as one of two element-connecting electrodes, and also serve as a heat sink for the elements. The other metal film is selectively etched to form a pattern of metallic contacts, which is then used as a mask for etching away portions of the wafer to form mesa-shaped diodes.

The multiple-diode array is completed by forming the other element-connecting electrode which interconnects the metallic contacts. Various bonding techniques have been used for electrically interconnecting the elements such as, for exmaple, simple bonding interconnecting leads to the metallic contacts. However, in order to effectively bond leads to each element, such bonding techniques necessarily exert physical pressure upon the elements, and where the diameter of each mesa-shaped element is made small in order to reduce the temperature rise as explained above, this bonding pressure often causes the metallic contacts to come off and sometimes strains the small mesa-shaped diodes causing undesirable cracks and other defects, thereby resulting in a low yield.

In the drawings:

FIG. 1 is a cross-sectional view showing a typical starting substrate used in the present novel method.

FIGS. 2, 3 and 5 are a series of plan views showing a succession of steps illustrating the present novel method.

FIG. 4 is a cross-sectional view taken along line 4—4 of FIG. 3.

FIG. 6 is a cross-sectional view taken along line 6—6 of FIG. 5.

FIGS. 7 and 8 are cross-sectional views illustrating other steps in the present novel method.

Referring to FIG. 1 of the drawings, there is shown a typical starting substrate 10 used in the present novel method of manufacturing a semiconductor device. The substrate 10 comprises a semiconductor wafer, in this example a silicon wafer 12, doped with conductivity modifiers to form a desired structure for the resulting manufactured device. Preferably, metallic layers have been deposited on both sides of the wafer 12 using any conventional deposition process such as, for example, vacuum sputtering. An electrically-conductive base comprising, for example, a layer 14 of copper is disposed adjacent to a first surface 16 of the wafer 12. This copper layer 16 provides structural support for the subsequently fabricated device, acts as one of two electrodes, and also serves as a heat sink for the device. Leads, which are gold wires in the present embodiment, are subsequently bonded to a surface 18 of a metallic structure 20 disposed adjacent to a second surface 22 of the wafer 12. Since gold leads are used in the present example, the metallic structure 20 comprises, preferably, a layer 24 of platinum disposed upon a layer 26 of chromium disposed adjacent to the second surface 22 of the wafer 12. Typically, the layer 24 of platinum is about 2500° in thickness and the layer 26 of chromium is about 100° in thickness. The layer 26 of chromium forms a tenaciously adherent bond with the silicon wafer 12 to help prevent lifting of the metallic structure 20 from the second surface 22 of the wafer 12, while the layer 24 of platinum acts as a barrier metal to insure that the gold of the subsequently bonded leads does not penetrate to the silicon wafer 12, since this is generally undesirable.

The first step of the preferred method comprises forming on the surface 18 of the substrate 10 a mask 28, shown in plan view in FIG. 2, having openings therein exposing portions 30 of the surface 18 of the substrate 10 which, in this example, are portions of the platinum layer 24. Since this mask 28 is used to define a pattern of material subsequently formed, in this example, by electroplating a layer of gold on the exposed surface portions 30, the mask 28, in the present example, comprises insulating material. Preferably, the mask 28 is photoresist and is formed by using conventional photolighographic processes.

Leads 32, preferably wires which are gold in the present example, are then bonded through the openings in the mask 28 to the exposed surface portions 30 of the substrate 10 and to each other, as shown in FIGS. 3 and 4, in order to interconnect the surface portions 30. The leads 32 are ultrasonically bonded to the surface portions 30 and to each other in the present embodiment, however, any bonding technique may be used.

The openings in the mask 28 are utilized to define a pattern of material which is then formed on the surface 18 of the substrate 10 covering the exposed surface portions 30 of the substrate 10. This material is one which is capable of masking the substrate 10 during a subsequent removing step wherein a section of the substrate 10 not covered by the material is removed. In the present embodiment this material is gold and is deposited, preferably, by electroplating the gold, through the openings in the mask 28, onto the exposed surface portions 30 of the substrate 10. Since this depositing step is performed after the bonding step and by electrolysis in the preferred method, gold is also electroplated simultaneously on the leads 32. Therefore, this electroplated material comprises, as shown in FIGS. 5 and 6, layer portions 34 which contact and bound the exposed surface portions 30 of the platinum layer 24, and other portions 36 which are adjacent to the leads 32 and separated from the platinum layer 24 by the mask 28 which, in the present example, is photoresist. The contacting layer portions 34 are adjacent to the other portions 36 and are continuous therewith, as shown in FIG. 5. Preferably, the contacting layer portions 34 are much thicker than the underlying metallic structure 20 and have a thickness of about 10 micrometers. By electroplating on the leads 32, the bonds connecting the leads 32 to the exposed surface portions 30 and to each other are strengthened substantially.

After the deposition of the layer portions 34 of material on the exposed surface portions 30 of the substrate, the mask 28, including portions thereof lying beneath the leads 32, is completely removed, whereby a section 38 of the substrate 10 is exposed, as shown in FIG. 7. The layer portions 34 now form the pattern which is utilized for masking the substrate 10 while removing the exposed section 38. The mask 28 in the present example is photoresist which is easily removed by using a conventional photoresist remover.

The section 38 of the substrate 10 exposed by the layer portions 34 is then removed. This section 38 may be removed by any technique which is capable of utilizing the layer portions 34 of material as a mask and which does not affect the leads 32. In the preferred embodiment, the removing step is performed by first removing a section of the metallic structure 20 exposed by the layer portions 34 by using ion-beam milling, for example, whereby a section of the silicon wafer 12 is exposed. The ion-beam milling process utilizes a singly ionized argon beam, neutralized by a cloud of electrons, directed at the exposed section of the metallic structure 20, which in the present example comprises sections of the layer 26 of chromium and layer 24 of platinum. The ion beam is directed under the interconnecting leads 32 at two or three angles in order to avoid having the interconnecting leads 32 form a shadow on the exposed section of the metallic structure 20. The ion-milling process occurs through the transfer of momentum by the incoming ions to the atoms of the metallic structure 20. When the energy transferred exceeds that of the finding energy (5 to 10 eV), removal of atoms will occur. This process mills everything in the path of the beam including some of the gold. However, since the layer portions 34 of gold are much thicker than the underlying metallic structure 20, the layer portions 34 of gold are only reduced in thickness and still remain to constitute a masking structure.

The exposed section of the silicon wafer 12 is removed next by etching through to the layer 14 of copper, utilizing the layer portions 34 as a mask. The section of the silicon wafer 12 exposed by the ion-beam milling is etched through to the copper layer 14 by using any wellknown silicon etchant such as, for exmaple, a solution of nitric acid and hydrofluoric acid in the ratio of 9:1, by volume. The removing step forms mesa-shaped elements 40 disposed beneath the patterned layer 34 of material, thereby creating a semiconductor array having a plurality of mesa-shaped elements 40 interconnected by the leads 32, as shown in FIG. 8.

By bonding the leads 32 to the surface portions 30 of the substrate 10 prior to removing the exposed section 38 of the substrate 10, the leads 32 can be effectively bonded to the mesa-shaped elements 40 while eliminating the problems mentioned above associated with the pressure exerted on the individual elements 40 during the bonding step. The section 38 of the substrate 10 which is left in place during the bonding step provides structural support which avoids problems such as having metallic contacts come off and other defects in the elements 40 caused by excessive strain on the individual elements 40. Consequently, the improved method of the present invention results in a higher yield, thereby achieving economies in production.

We claim:

1. In a method of manufacturing a semiconductor device having a lead bonded to a surface thereof wherein said device is fabricated by bonding said lead to a portion of a surface of a substrate comprising said surface of said device and then removing a section of said substrate surrounding said surface portion of said substrate, the improvement in said method comprising the steps of:
    forming on said surface of said substrate, prior to said bonding step, a mask having an opening therein exposing said surface portion of said substrate,
    depositing above said exposed surface portion, after said bonding step, a layer of material capable of masking said substrate during said step of removing said section, and
    removing said mask, whereby said layer of material forms a pattern of material exposing said section of said substrate.

2. A method as recited in claim 1 wherein said material is metal, said lead is a wire, said mask comprises insulating material, and said substrate comprises a semiconductor wafer upon which is disposed a metallic structure containing said surface portion, and wherein said depositing step is performed by electroplating said layer on said exposed surface portion of said substrate and further comprises electroplating simultaneously on said wire.

3. A method as recited in claim 2 wherein said mask is photoresist.

4. A method as recited in claim 2 wherein said wire and said metallic material are gold, said wafer is silicon, said metallic structure comprises a layer of platinum disposed upon a layer of chromium, and wherein said bonding step is performed by ultrasonically bonding a segment of said wire to said exposed surface portion of said platinum layer.

5. A method as recited in claim 4 wherein said step of removing said section of said substrate is performed by first removing a section of said metallic structure exposed by said layer of gold using ion-beam milling, whereby a section of said wafer is exposed, and then removing said exposed section of said wafer by etching, utilizing said layer of gold as a mask.

6. A method of manufacturing a semiconductor array having a plurality of interconnected mesa-shaped elements, comprising the steps of:
    forming on a surface of a substrate a mask having openings therein exposing isolated portions of said surface,
    bonding leads to said exposed surface portions to interconnect said surface portions, depositing above said exposed surface portions, a layer of material capable of masking said substrate during a subsequent removing step, removing said mask, whereby said layer of material forms a pattern of material exposing a section of said substrate, and removing, after bonding said leads, said section of said substrate to fabricate said elements.

7. A method as recited in claim 6 wherein said material is metal, said leads are wires, said mask is photoresist, and said substrate comprises a semiconductor wafer having a first side thereof adjacent to an electrically-conductive base and a second side thereof adjacent to a metallic structure containing said surface portions, and wherein said depositing step is performed by electroplating said layer on said exposed surface portions of said substrate and further comprises electroplating simultaneously on said wires.

8. A method as recited in claim 7 wherein said wires and said material are gold, said wafer is silicon, said base comprises a layer of copper, said metallic structure comprises a layer of platinum disposed upon a layer of chromium, and wherein said bonding step is performed by ultrasonically bonding segments of said wires to exposed surface portions of said platinum layer.

9. A method as recited in claim 8 wherein said step of removing said section of said substrate is performed by first removing a section of said metallic structure exposed by said layer of gold using ion-beam milling, whereby a section of said wafer is exposed, and then removing said exposed section of said wafer by etching through to said base, utilizing said layer of gold as a mask.

* * * * *